United States Patent [19]

Shimokawa

[11] 4,180,797

[45] Dec. 25, 1979

[54] DIGITAL COMPARATOR CONSTRUCTED OF IIL

[75] Inventor: Ryushi Shimokawa, Fuchu, Japan

[73] Assignee: Hitachi, Ltd., Japan

[21] Appl. No.: 936,136

[22] Filed: Aug. 23, 1978

[30] Foreign Application Priority Data

Sep. 7, 1977 [JP] Japan .................................. 52-106590

[51] Int. Cl.² .............................................. G06F 7/04
[52] U.S. Cl. .............................. 340/146.2; 235/92 CA
[58] Field of Search ............... 340/146.2; 235/92 CA, 235/92 T; 354/267

[56] References Cited

U.S. PATENT DOCUMENTS

| | | | |
|---|---|---|---|
| 3,517,175 | 6/1970 | Williams | 340/146.2 |
| 3,622,987 | 11/1971 | Borkan | 340/146.2 |
| 3,676,849 | 7/1972 | Malandro et al. | 340/146.2 X |
| 3,836,908 | 9/1974 | Hegendorfer | 340/146.2 X |
| 3,878,370 | 4/1975 | Santomanyo et al. | 235/42 T |
| 3,886,571 | 5/1975 | Miyakawa et al. | 354/267 X |
| 4,109,141 | 8/1978 | Sasaki | 235/92 CA |

OTHER PUBLICATIONS

Frankeny, "Count Comparison," *IBM Tech. Disclosure Bulletin*, vol. 13, No. 4, Sep. 1970, p. 980(a).
Lane, "A Monolithic Time Interval Generator," *Proceedings of the 1974 IEEE International Symposium on Circuits & Systems*, 1974, pp. 386-388.

*Primary Examiner*—David H. Malzahn
*Attorney, Agent, or Firm*—Craig and Antonelli

[57] ABSTRACT

In a digital comparator wherein a period of time taken until one output signal of a decoder circuit coincides with one corresponding output signal of a frequency divider circuit is measured by comparing output signals of the decoder circuit and output signals of the frequency divider circuit, an output circuit of the decoder circuit and an output circuit of the frequency divider circuit are constructed of integrated injection logic (IIL) in order to build up wired AND circuits, and further, a NOR circuit which includes inverter circuits constructed of IIL and a common connection line for connecting outputs of the inverter circuits in common is disposed in order to receive respective outputs of the wired AND circuits. Especially, the digital comparator of this invention is effective for an automatic exposure control system of a camera.

6 Claims, 10 Drawing Figures

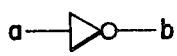
FIG. 2
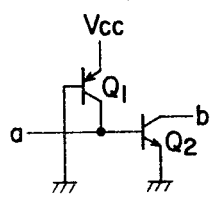
FIG. 3
FIG. 4
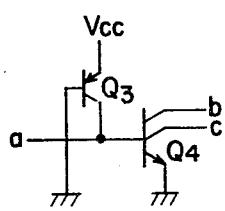
FIG. 5
FIG. 6
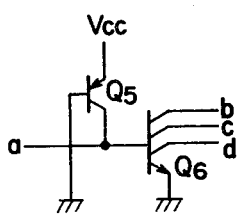
FIG. 7
FIG. 8
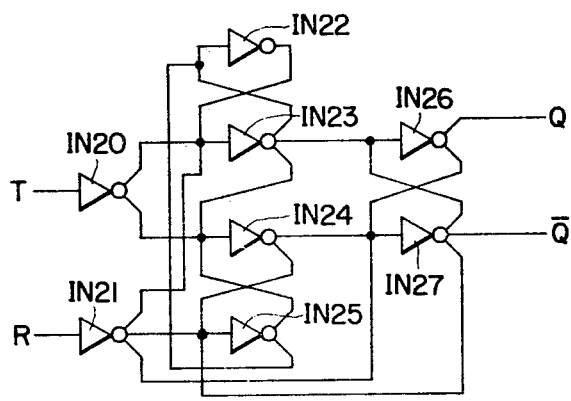
FIG. 9
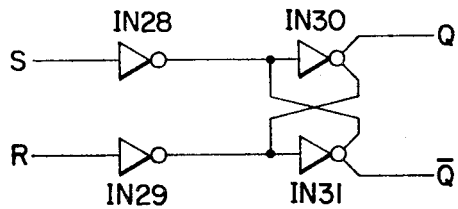

DIGITAL COMPARATOR CONSTRUCTED OF IIL

BACKGROUND OF THE INVENTION

This invention relates to a digital comparator, and more particularly to a digital comparator which is used for forming timing signals.

A digital comparator for forming timing signals is required in, for example, an automatic exposure control system of a camera.

In the automatic exposure control system of a camera in which a control portion of a shutter is constructed of an electronic circuit, a CR time constant circuit consisting of a resistor and a capacitor is usually employed so as to continuously vary the shutter speed. Since, however, the system employing the CR time constant circuit is inferior in accuracy, it is requested to digitalize the shutter control circuit. In this case, a digital comparator becomes necessary which compares a timing pulse and a set digital value to obtain a predetermined shutter speed.

Heretofore, the digital comparator has been constructed of exclusive OR circuits, which has resulted in the disadvantage of a complicated circuit arrangement. It has accordingly been difficult to put timing signal generators of the shutter control circuit etc. into digital circuits.

SUMMARY OF THE INVENTION

It is therefore an object of this invention to provide a digital comparator which has a simple circuit arrangement.

Another object is to provide a digital comparator which is suitable for application to the automatic exposure control system of a camera.

By exploiting the fact that the unit circuit of IIL (integrated injection logic) has an open collector structure, this invention forms wired AND and wired OR and constructs a digital comparator by the use of the AND and OR circuits.

The above-mentioned and further objects and features of this invention will be clearly understood from the following description of the invention taken with reference to the drawings.

BRIEF DESCRIPTION OF THE DRAWINGS

FIG. 2 shows an inverter which has one input and one output.

FIG. 3 is a diagram of a circuit in which the inverter shown in FIG. 2 is constructed of IIL.

FIG. 4 shows an inverter which has one input and two outputs.

FIG. 5 is a diagram of a circuit in which the inverter shown in FIG. 4 is constructed of IIL.

FIG. 6 shows an inverter which has one input and three outputs.

FIG. 7 is a diagram of a circuit in which the inverter shown in FIG. 6 is constructed of IIL.

FIG. 8 is a circuit diagram of a trigger type flip-flop which is constructed of IIL.

FIG. 9 is a circuit diagram of an S-R flip-flop which is constructed of IIL.

DESCRIPTION OF THE PREFERRED EMBODIMENTS

Hereunder, this invention will be concretely described in connection with embodiments.

Figure 1:
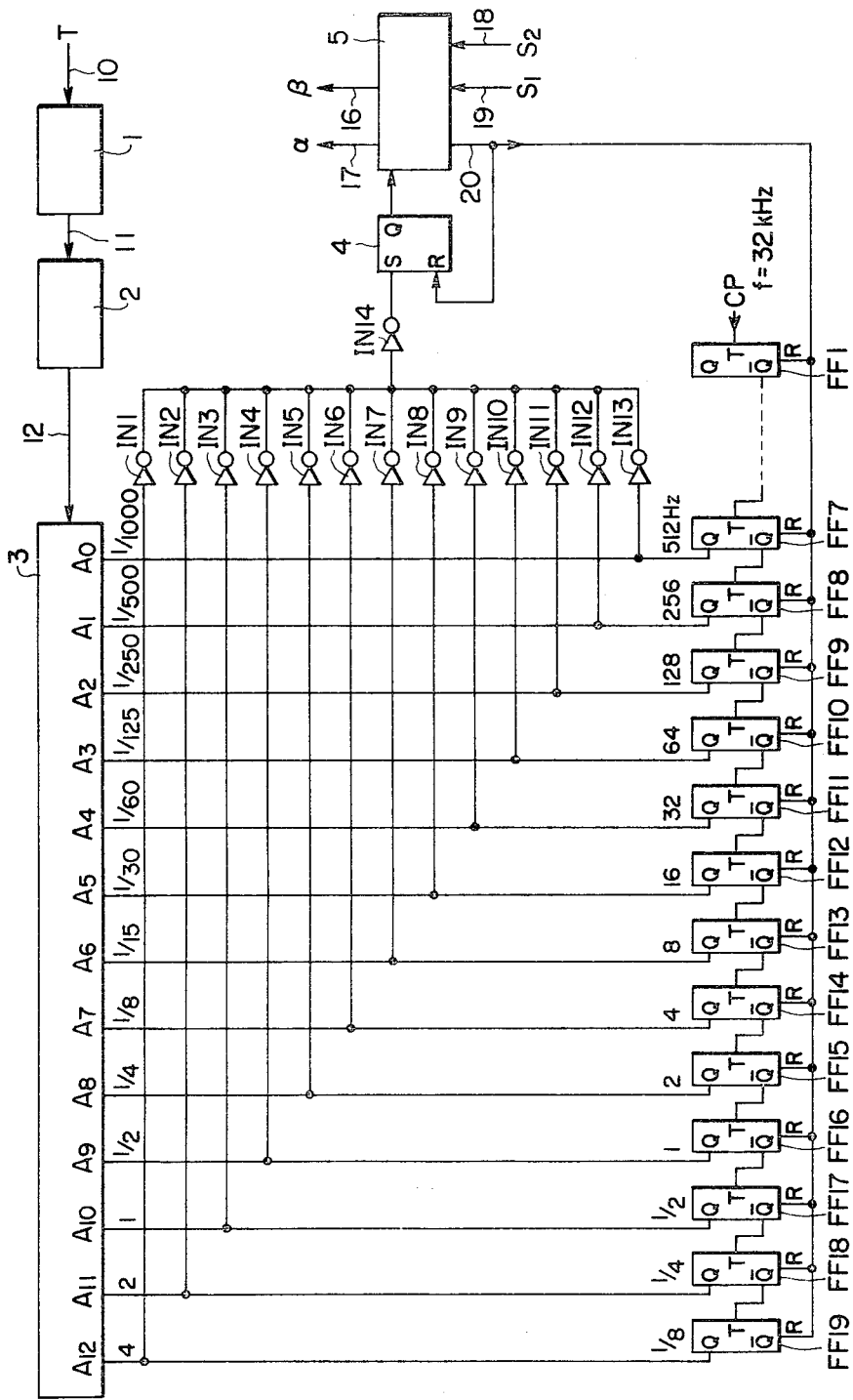
FIG. 1 is a circuit diagram showing an embodiment in the case where a digital comparator of this invention is applied to the automatic exposure control system of a camera.

FIG. 1 is a circuit diagram showing an embodiment in the case where this invention is applied to the automatic exposure control system of a camera. Referring to the figure, numeral 1 designates an analog to digital converter (A-D converter) which converts into a digital value a shutter speed value (T) entered as an analog value.

Numeral 2 designates a memory circuit which serves to store the digital conversion output of the A-D converter 1.

Shown at 3 is a decoder circuit. It provides a decoded output at any one of its output terminals $A_0$–$A_{12}$ in correspondence with a binary signal of the shutter speed which appears at an output terminal 12 of the memory circuit 2. More specifically, the respective digits of the output terminals $A_0$–$A_{12}$ are endowed with weights of 4, 2, 1, $\frac{1}{2}$, $\frac{1}{4}$ ... and 1/1000 seconds as shown in the figure. Only the selected one of the output terminals is brought into a high level. Thus, the shutter speed value is indicated.

This circuit 3 is constructed of IIL because a digital comparator is constructed of wired AND circuits as will be stated later. It is constructed of, for example, a logical circuit which provides the high level selectively by combining the stored output of the memory circuit 2 and an inverted signal thereof. Since it is constructed on the basis of the same concept as in circuits generally used in binary-coded decimal decoders etc. of electronic desk calculators etc., it will not be explained in detail. The final stage of the circuit 3 includes inverters based on IIL as shown in FIG. 3, and the output terminals $A_0$ to $A_{12}$ thereof are made up of open collectors of IIL.

FF1 to FF19 denote trigger type flip-flops. Each trigger type flip-flop is made up of inverters IN20 to IN27 of IIL which has one to three output terminals as shown in FIG. 8. The details of the respective inverters in FIG. 8 are shown in FIGS. 2 to 7. A circuit in which the inverter of FIG. 2 having a single output end b is constructed of IIL is shown in FIG. 3. A circuit in which the inverter of FIG. 4 having two output ends b and c is constructed of IIL is shown in FIG. 5. Likewise, a circuit in which the inverter having three output ends b to d as illustrated in FIG. 6 is constructed of IIL is shown in FIG. 7. Thus, the inverters constituting the flip-flop are formed by the well-known IIL technique.

Each inverter is made up of an injector formed of a lateral pnp-transistor $Q_1$, $Q_3$ or $Q_5$, and an inverse npn-transistor $Q_2$, $Q_4$ or $Q_6$. Therefore, the output end or ends of each inverter become the open collector structure.

In FIG. 8, the output ends connected in common among different inverters construct wired AND circuits.

Referring again to FIG. 1, the trigger type flip-flops FF1 to FF19 are connected in cascade. Therefore, they function as a frequency divider for a clock pulse signal CP of 32 KHz entered into the first stage FF1. As a result, each flip-flop circuit produces an output signal which has a divided frequency.

Figure 10:
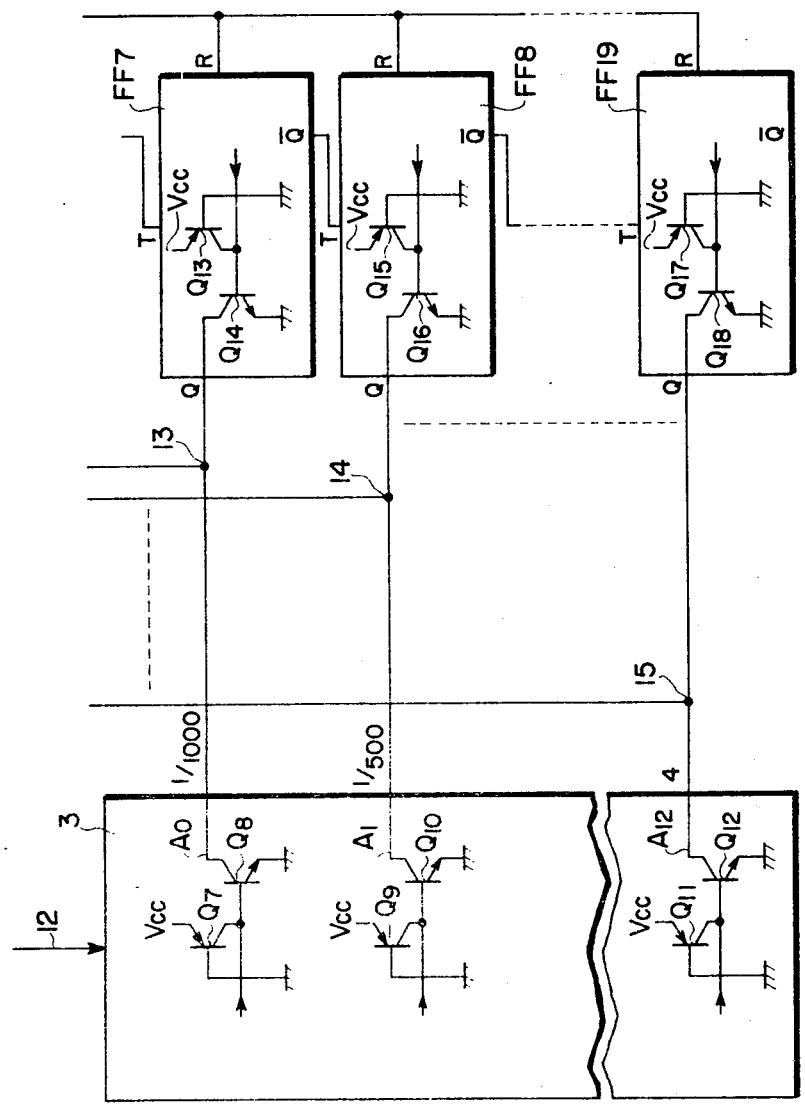
FIG. 10 is a circuit diagram in which the digital comparator of this invention shown in FIG. 1 is partially illustrated as a circuit arrangement of IIL.

In the various stages, the output terminals of from the output terminal Q of the final stage FF19 generating pulses for 4 seconds (the outputs of the frequency divider have a duty of 50%, and the period of time in which a signal of ⅛ Hz reaches the high level is 4 seconds) to the output terminal Q of the seventh stage FF7 generating pulses for about 1/1000 second (512 Hz) are respectively caused to correspond to the output terminals $A_{12}$–$A_0$ of the decoder 3 and directly coupled therewith. That is, as shown in FIG. 10, the open collector terminals of the decoder 3 and the open collector terminals of the flip-flops are directly connected. As a result, points of the direct coupling as indicated at 13, 14 and 15 function as wired AND circuits respectively. Since the points of direct coupling construct the wired AND circuits, each of the flip-flops FF1 to FF19 uses one output terminal (inverting output terminal) $\overline{Q}$ as a terminal for supplying a signal to the succeeding stage and the other output terminal (non-inverting output terminal) as an output terminal to the wired AND circuit. This serves to prevent the frequency dividing operation from failing due to the output level of the decoder circuit 3.

Output signals appearing at the points of direct coupling are respectively applied to inputs of inverter circuits IN1-IN13, and output lines of these inverter circuits are connected in common. Thus, a wired NOR circuit is constructed. An output from the wired NOR circuit is inverted by an inverter circuit IN14. As a result, a circuit extending from the points of direct coupling to an output terminal of the inverter IN14 operates as an OR circuit. The OR output is used as a set input of a flip-flop 4. The details of the flip-flop 4 are shown in FIG. 9. Likewise to the flip-flop of FIG. 8, this circuit 4 is constructed of IIL employing the inverters shown in FIGS. 2 to 5.

Shown at 5 is a control circuit. It receives as an input a control signal $S_1$ which is generated upon turning-on of a first-stage release switch of release switches (not shown) of two stages of strokes in the camera, and it puts both drive signals $\alpha$ and $\beta$ of a shutter into a high level (power supply level) with the input control signal $S_1$, thereby to hold a front shutter blind and a rear shutter blind of the shutter at predetermined positions.

Subsequently, the second-stage release switch is turned "on" to enter a second control signal $S_2$. Thus, the holding signal $\alpha$ for the front shutter blind is put into a low level (ground level), to cause the front shutter blind to run and to start an exposure. Simultaneously therewith, the frequency divider circuit FF1-FF19 and the flip-flop 4 are released from the reset state. In consequence, the frequency divider circuit FF1-FF19 operates.

When the frequency division output has coincided with the output of the selected one output terminal of the decoder 3, the input of a selected one of the inverter circuits IN1-IN13 becomes the high level, and the output thereof becomes the low level. Further, this signal sets the flip-flop 4 through the inverter IN14. Using a set signal from a terminal Q of the flip-flop 4, the control circuit 5 puts the holding signal $\beta$ for the rear shutter blind into the low level, to cause the rear shutter blind to run and to end the exposure.

For example, when the shutter time is set at 1/60 second, only the output terminal $A_4$ (1/60) of the decoder circuit 3 becomes "1" (high level) and all the other output terminals are "0" (low level). 1/60 second after the frequency divider circuit has initiated the frequency dividing operation, the flip-flop FF11 at the eleventh stage becomes the high level. Thus, the input of the inverter circuit IN9 becomes the high level, so that the low level is obtained at the output thereof. The low level signal is inverted by the inverter circuit IN14, to set the flip-flop 4 at this timing.

Thereafter, the counter output of 32 Hz changes in a period of 1/30 second (the high level and the low level are repeated every 1/60 second). However, the flip-flop 4 holds the set state unless it is reset.

With a rise (positive edge) at the output terminal Q of the flip-flop 4, the control circuit 5 puts the rear shutter blind-holding signal $\beta$ into the low level to cause the rear shutter blind to run, whereby a shutter release time conforming with the set value of the shutter time can be attained.

After termination of the series of operations, the control circuit 5 provides a reset signal R at a reset terminal 20, whereby the frequency divider circuit FF1-FF19 and the flip-flop 4 are reset and the operations as above stated are conducted again.

In this embodiment, the circuit of the open collector structure is employed as the circuit for forming the digital signal to be compared. The wired AND and wired OR circuits can therefore be utilized for the digital comparator, so that the circuit arrangement becomes very simple. The digital comparator can be made suitable for the form of a semiconductor integrated circuit by exploiting the IIL as the circuit of the open collector structure and conjointly with the simplification of the circuit arrangement.

This invention can be utilized, not only for the digital comparator as the timing generator circuit for the shutter speed control of the camera, but also for e.g. a digital comparator for the iris control of the camera. In this case, a set iris value is formed by the decoder circuit as in the previous description, and the high level is sequentially shifted by a shift register in conformity with a quantity of iris of one step. Thus, the coincidence of both the values can be detected by circuits as previously described.

In the foregoing embodiments, the set values of the shutter speed etc. may well be entered in the form of digital values. In that case, the analog to digital converter 1 becomes unnecessary. If the flip-flop 4 is adapted to be set by a negative edge, the inverter IN14 is unnecessary.

In order to form the open collector outputs, inverter circuits of IIL may be employed for some of the outputs of the decoder circuit or the frequency divider circuit.

I claim:
1. A digital comparator comprising:
an information output circuit which has a plurality of output terminals and which represents a predetermined information with a digital signal appearing at a selected one of the output terminals, said information output circuit including switching transistors at an output stage respectively connected to said output terminals;
a reference signal generator circuit which has a plurality of output terminals disposed in correspondence with those of said information output circuit and which sequentially impresses reference signals on the respective output terminals, said reference signal generator circuit including switching transistors at an output stage with their respective collectors connected to said output terminals;

wired AND circuits which are made up of connection lines respectively connecting collectors of the output-stage switching transistors of said information output circuit and the output-stage switching transistors of said reference signal generator circuit corresponding thereto, and output lines disposed for the respective connection lines;

a NOR circuit which is made up of inverter circuits constructed of integrated injection logic (IIL) and incorporated in the respective output lines of said wired AND circuits, and a common connection line for electrically connecting outputs of said inverter circuits in common; and a memory circuit which is driven by an output of said NOR circuit.

2. A digital comparator according to claim 1, wherein a second inverter circuit constructed of integrated injection logic (IIL) is interposed between the output of said NOR circuit and said memory circuit, whereby said second inverter circuit is operated as an OR circuit together with said NOR circuit.

3. A digital comparator according to claim 1, wherein said information output circuit, said reference signal generator circuit and said memory circuit are constructed of integrated injection logic (IIL) circuits.

4. A digital comparator according to claim 1, wherein said information output circuit is made up of a decoder circuit, and said reference signal generator circuit is made up of a frequency divider circuit.

5. A digital comparator according to claim 1, wherein said information output circuit is disposed in order to provide information representative of shutter speeds of a camera, and said reference signal generator circuit is disposed in order to provide reference signals each of which develops in response to the shutter speed and after a predetermined period of time from a reference time.

6. A digital comparator according to claim 1, wherein said reference signal generator circuit and said memory circuit have control input signal terminals for setting their initial states, respectively, and an operation of said digital comparator is started by control input signals applied to said control input signal terminals.

* * * * *